United States Patent [19]
Gabriel

[11] Patent Number: 5,397,433
[45] Date of Patent: Mar. 14, 1995

[54] METHOD AND APPARATUS FOR PATTERNING A METAL LAYER

[75] Inventor: Calvin T. Gabriel, Cupertino, Calif.

[73] Assignee: VLSI Technology, Inc., San Jose, Calif.

[21] Appl. No.: 109,728

[22] Filed: Aug. 20, 1993

[51] Int. Cl.⁶ ............................................. H01L 21/00
[52] U.S. Cl. .................................. 156/665; 156/643; 156/646; 156/659.1
[58] Field of Search ..................... 156/659.1, 643, 646, 156/664, 665

[56] References Cited

U.S. PATENT DOCUMENTS

| | | | |
|---|---|---|---|
| 4,380,488 | 4/1983 | Reichelderfer et al. | 156/643 |
| 4,758,306 | 7/1988 | Cronin et al. | 156/643 |
| 4,919,750 | 4/1990 | Bausmith et al. | 156/643 |
| 5,246,888 | 9/1993 | Miyamoto | 156/643 |

FOREIGN PATENT DOCUMENTS

| | | |
|---|---|---|
| 60-033367 | 2/1985 | Japan . |
| 4-067624 | 3/1992 | Japan . |
| 4-199824 | 7/1992 | Japan . |
| 2087315 | 5/1982 | United Kingdom . |

OTHER PUBLICATIONS

"Plasma Beam Studies of Silicon and Aluminum Etching Mechanisms", J. Vac. Sci. Tech., 21(3), 768–773; Smith et al.; Oct. 1982.

"Anisotropic Etching of Polysilicon In A Single-Wafer Aluminum Etch Reactor"; J. Vac. Sci. Tech., B, 9(3), 1596–1597; Maa et al., Jun. 1991.

"Precise Reactive Ion Etching of Ta Absorber on X-Ray Masks"; Jpn. J. Appl. Phys. 1, Reg. Papers, Short Notes, vol. 36, No. 11B, pp. 3065–3069, Nov. 1991; Nakaishi et al.

"High Rate Anisotropic Aluminum Etching"; J. Electrochem. Soc. 130(6), 1369–1373; Bruce et al; 1983.

"A Process for Improved Aluminum (Copper) Reactive Ion Etching"; J. Vac. Sci. Tech; A, 7(3, Pt. 1), pp. 682–685; Hu et al.; Jun. 1989.

"Dry Etching of Titanium Nitride (TiN)/Aluminum (Copper)/Silicon for Very Large Scale Integrated Local Interconnections"; J. Vac. Sci. Tech., A, 8(3, Pt. 1), pp. 1498–1502; Hu et al.; Jun. 1990.

Mathad, G. S. & Hess, D. W., "Proceedings of the Ninth Symposium on Plasma Processing," Dielectric Science & Technology & Electronics Divisions, vol. 92-18, pp. 367–373.

Letter dated Feb. 16, 1992 from The Electrochemical Society, Inc. confirming that "Proceedings of the Ninth Symposium on Plasma Processing" was published on Sep. 21, 1992.

D. Pramanik et al., "A Submicron Triple Level Metallization Process for High Performance Application Specifics Circuits," VMIC Conference, San Jose, California, Jun. 9–10, 1992, pp. 37–43.

Overhead slides presented during the "Ninth Symposium on Plasma Processing" conference on May 17–22, 1992.

"Silicon Processing For VLSI Era"; vol. 1; Wolf et al.; ©1986; Lattice Press; Sunset Beach, Calif.; pp. 565–567, 579.

*Primary Examiner*—R. Bruce Breneman
*Assistant Examiner*—George Goudreau
*Attorney, Agent, or Firm*—Hickman & Beyer

[57] ABSTRACT

The present invention provides both method and apparatus for patterning a metal layer through a mask layer. A substrate or wafer having a metal layer covered by a mask layer is first placed into a chamber for processing. An etch plasma is then created over the substrate by applying energy into the chamber with an RF energy source while a gas flow is supplied into the chamber. The gas flow preferably includes chloroform and chlorine in a predetermined ratio of flow rates. By application of the process and the means for performing the process, optimal sidewall profiles for both dense and isolated metal lines can be achieved on a single die in a single process step. Specifically, dense metal lines are etched with vertical sidewalls and isolated metal lines are etched with sloped sidewalls.

15 Claims, 6 Drawing Sheets

METHOD AND APPARATUS FOR PATTERNING A METAL LAYER

BACKGROUND OF THE INVENTION

1. Field of the Invention

This invention relates to semiconductor wafer processing and more particularly to methods for patterning lines in a metal layer formed over a semiconductor wafer.

2. Background of the Technical Art

The production of packaged integrated circuits (I.C.'s) involves many processes. A key element of these I.C.'s is the semiconductor die or "chip" that is patterned in accordance with the circuit design. An important process in the production of I.C. die is the patterning of the metal layer(s) that form the interconnections between the various circuit components. These interconnections or lines can be both narrowly and widely spaced on a single die depending upon design requirements.

FIGS. 1a–1c illustrate a series of steps during a prior art patterning process of a metal layer formed over a semiconductor wafer. In FIG. 1a, a metal layer 10 lies over a substrate 12, preferably an oxide layer overlying a semiconductor wafer, such as a silicon wafer 13. A mask 14 comprising a pattern of photoresistive material is formed over the metal layer 10 by techniques well known to those skilled in the art of I.C. photolithography. After the mask 14 has been formed, the metal layer 10 is etched by either a wet or dry etch process as is well known to those skilled in the art to form the metal lines shown in FIG. 1b. FIG. 1c shows the resultant pattern of metal lines 16 after removal of the mask 14. Although the lines shown in FIG. 1c all have vertical sidewalls for purposes of illustration, this is not necessarily a consistent or ideal result for all line patterns.

In FIGS. 2a–2c, several variations in the profile shape of densely packed etched metal lines are shown. FIG. 2a shows closely packed lines 17a with vertical sidewalls formed over substrate 19a, FIG. 2b shows closely packed lines 17b with sloped sidewalls formed over substrate 19b, and FIG. 2c shows closely packed lines 17c with reentrant sloped sidewalls formed over substrate 19c. Problems occur when the lines are sloped as shown in FIGS. 2b and 2c. The sloped sidewalls of lines 17b as shown in FIG. 2b can cause shorting between the lines by direct contact of the sidewalls such as at point 18, or by a particulate 20 that can be trapped between two adjacent sidewalls. The reentrant sloping of lines 17c of FIG. 2c can cause problems in subsequent layering, because the deposited material comprising the next layer may not completely backfill under the sidewalls, so that holes or voids may then be present in the deposited layer, which may lead to failure of the I.C. chip. In order to avoid the problems nonvertical sidewalls cause in closely packed metal lines, it is typically best to etch densely spaced metal lines with vertical sidewalls as shown in FIG. 2a.

FIGS. 3a–3c present three typical profiles of isolated or widely spaced metal lines formed over a substrate. FIG. 3a shows an isolated line 22a with a substantially vertical sidewall, FIG. 3b shows an isolated line 22b with a sloped sidewall, and FIG. 3c shows an isolated line 22c with a reentrant sidewall. The lines 22a–22c, respectively, are formed over substrates 24a–24c, respectively. Oxide or other layers 26a–26c are formed over the respective lines 22a–22c, respectively.

The metal line 22a with vertical sidewalls is not the optimal configuration for isolated lines. This is because the oxide layer 26a conforms to the shape of the line 22a and thus does not present a planar surface for subsequent layers. The metal line 22c suffers from the same problem as the metal line 17c, namely the formation of voids in layer 26c, such as voids 27. The optimal shape for isolated lines is therefore the sloped sidewall of line 22b as shown in FIG. 3b. As illustrated, layer 26b overlying the sloped metal line 22b provides a more planar surface for any subsequent layering, and thus, the sloped sidewall of line 22b is preferred for isolated metal lines.

With the optimal sidewall shape differing for densely packed and isolated lines in the metal layer, the problem exists in consistently producing the preferred line shape on the same die. What is needed is a process that can produce both the vertical sidewalls optimal in dense metal lines and the sloped sidewalls optimal in isolated metal lines on the same die.

SUMMARY OF THE INVENTION

In accordance with the purpose of the present invention, a method and apparatus for etching a pattern into a metal layer through a mask is described. Advantageously, both isolated and dense metal lines with proper sidewall profiles can be produced on a substrate by controlling the flow rates of selected gases used in the etching process.

A method in accordance with the present invention involves the forming of a mask layer over a metal layer on a substrate with the mask layer comprising a region of closely spaced features and a region of more widely spaced features. The substrate is then placed into a chamber for processing. A flow of gases is created in the chamber and contains at least chloroform ($CHCl_3$) and chlorine ($Cl_2$). An etch plasma is then created in the chamber as the gases react to the application of energy from an energy source such as a radio-frequency (RF) energy source. This plasma etches the metal layer through the mask layer forming a pattern of lines on the substrate according to the pattern of more closely spaced and more widely spaced features on the mask. The more closely spaced lines are etched substantially ansiotropically, and the more widely spaced lines are etched with a positive aspect ratio such that their sidewalls are sloped outwardly.

The apparatus of the present invention includes a chamber and a mechanism for creating a gas flow of at least $CHCl_3$ and $Cl_2$ into the chamber. A mechanism for creating an etch plasma over the substrate is a further component and includes an RF energy source, which when activated, stimulates the reaction with the gas flow to form the plasma.

By the method and apparatus of the present invention, an optimal patterning of both isolated metal lines and dense metal lines on a single substrate can be achieved. With the provision of the chloroform, an atypical etching gas, in combination with a supply of chlorine into the chamber, the preferred sidewall shape, namely a vertical sidewall in dense lines and a sloped sidewall in isolated lines, is produced. This results in better yields and circuit performance by simultaneously providing vertical sidewalls for narrowly spaced lines and by providing angled sidewall profiles for isolated lines.

These and other advantages of the present invention will become apparent upon a reading of the following descriptions and a study of the various figures of the drawing.

DETAILED DESCRIPTION OF THE PREFERRED EMBODIMENTS

Figure 1A:
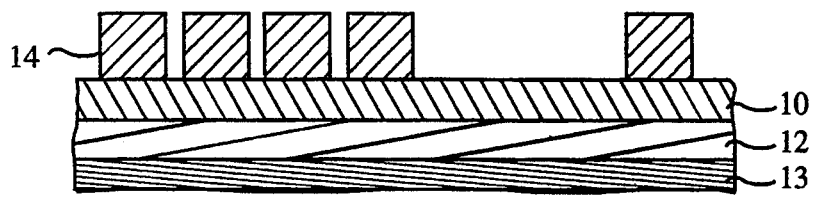
FIGS. 1a–1c illustrate a prior art metal line etching on a semiconductor wafer.
Figure 1B:
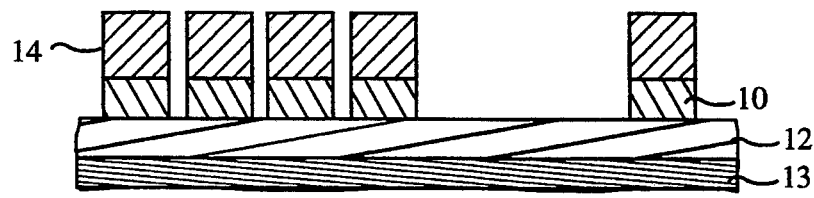
Figure 1C:
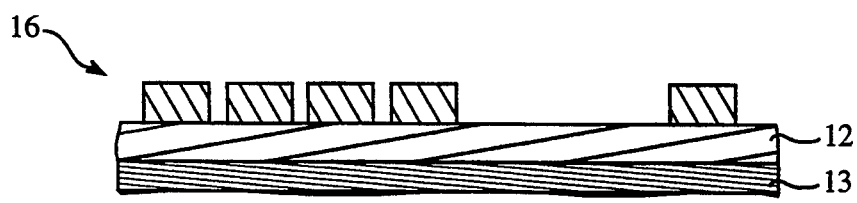
Figure 2A:
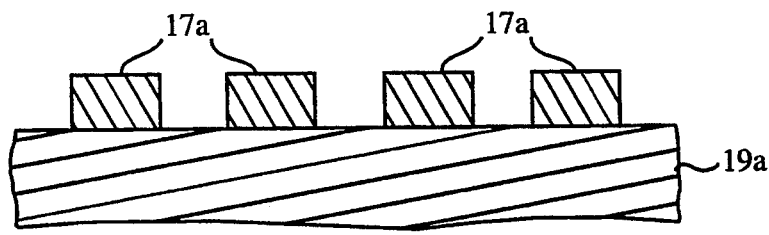
FIG. 2a illustrates a preferred vertical sidewall profile for narrowly spaced metal lines.
Figure 2B:
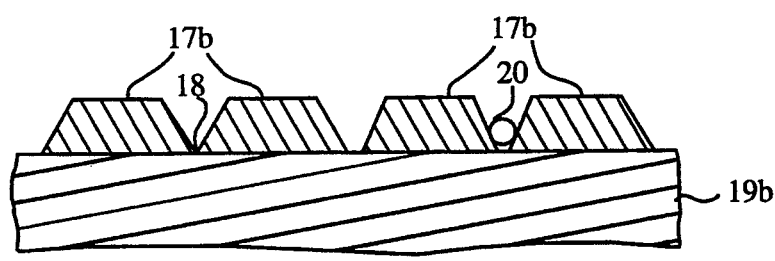
FIG. 2b illustrates a disadvantageously sloped sidewall profile with narrowly spaced metal lines.
Figure 2C:
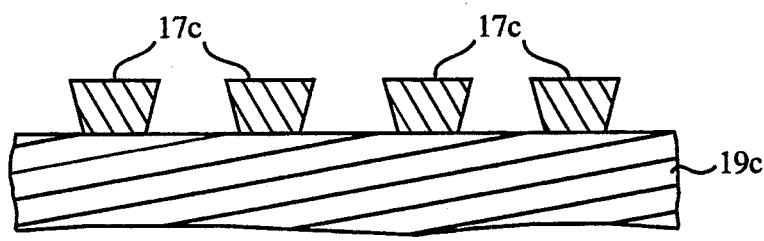
FIG. 2c illustrates a disadvantageous reentrant sidewall profile with narrowly spaced metal lines.
Figure 3A:
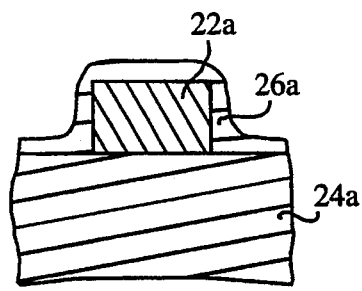
FIG. 3a illustrates a disadvantageous vertical sidewall profile of an isolated metal line covered by an oxide layer.
Figure 3B:
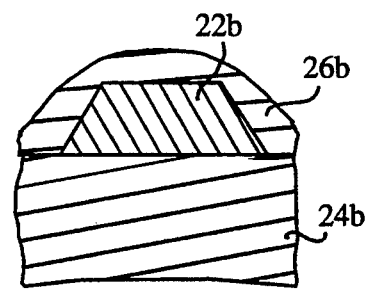
FIG. 3b illustrates an advantageously sloped sidewall profile of an isolated metal line covered by an oxide layer.
Figure 3C:
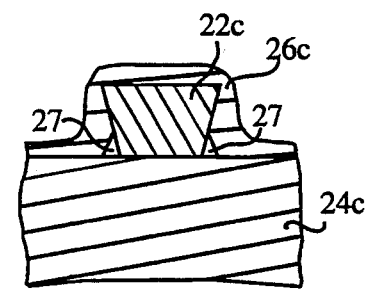
FIG. 3c illustrates a disadvantageous reentrant sidewall profile of an isolated metal line covered by an oxide layer.

FIGS. 1a–1c illustrate a prior art etching method for patterning metal lines, as previously described. FIGS. 2a–2c and FIGS. 3a–3c illustrate variations in sidewall profiles for narrowly spaced and isolated etched metal lines, respectively, as previously explained.

Figure 4:
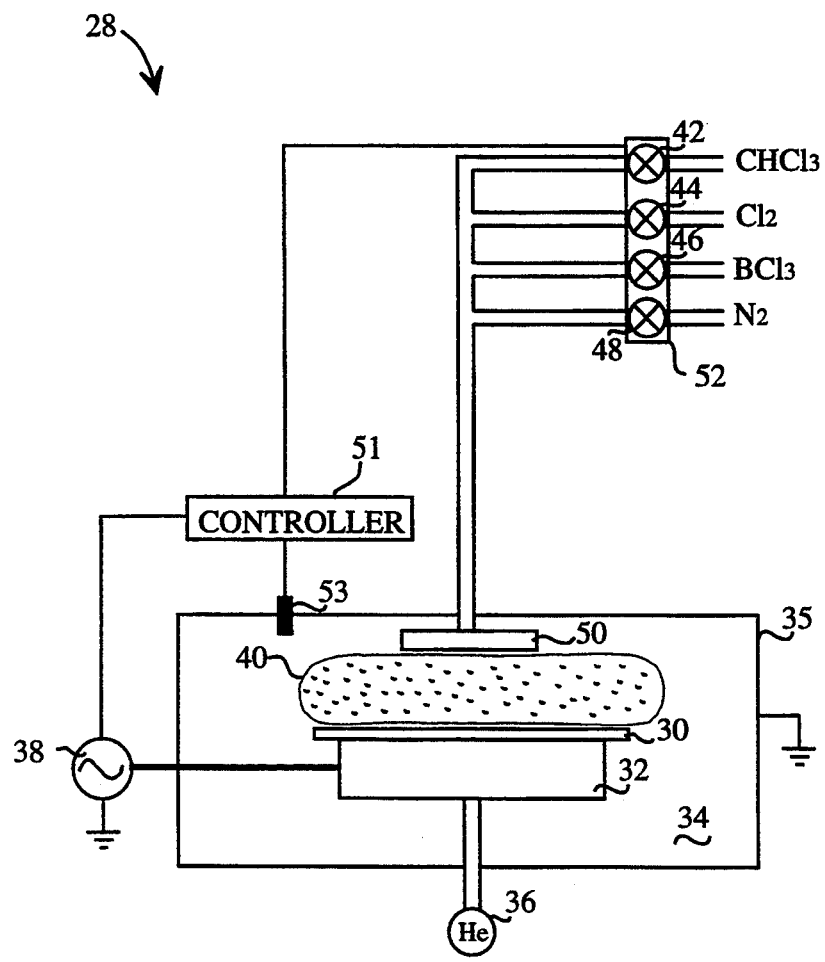
FIG. 4 is a schematic of an apparatus in accordance with the present invention.

FIG. 4 is a schematic of an apparatus 28 in accordance with the present invention. The basis of the apparatus 28 is a commercially available plasma etcher such as a LAM Rainbow 4600 Etcher from LAM Research, Fremont, Calif. A substrate 30, such as a silicon wafer, is placed on pedestal 32 inside chamber 34 by means of an automated mechanical arm or other suitable means and is held in position by clamps (not shown). The chamber 34 is defined by grounded conductive enclosure 35. The substrate 30 has been previously processed by techniques well known to those skilled in the art to pro, vide a metal layer comprising aluminum (Al) or an aluminum alloy, such as aluminum silicon (AlSi), aluminum copper (AlCu), or aluminum silicon copper (AlSiCu), covered by a photoresistive mask. A source of radio-frequency (RF) energy 38 is coupled to pedestal 32 to provide a mechanism for producing an RF field within the chamber 34. A plasma discharge 40 including positively charged ions is developed over wafer 30 by the reaction of the RF field with gases $CHCl_3$, $Cl_2$, $BCl_3$, and $N_2$ supplied through showerhead 50 into chamber 34. This reactive ion etch (RIE) is controlled by a controller 51 that regulates the gas flow rates into the chamber 34 by controlling a gas panel 52 including mass flow controllers 42, 44, 46, and 48 controlling the rate of flow of the $CHCl_3$, $Cl_2$, $BCl_3$, and $N_2$, respectively, into the chamber 34. An optical endpoint detector 53 connects to the controller 51 so that, upon detection of the conclusion of the RIE, signals from the controller 51 can shut off the RF energy 38 application and adjust the flow rates of $CHCl_3$, $Cl_2$, $BCl_3$, and $N_2$ through gas panel 52. Examples of suitable wavelengths to monitor for endpoint detection of Al alloy etching include 261.4 nanometers (nm), 308.2 nm, 309.3 nm, and 520 nm, which indicate that the Al to be etched has been exhausted and that a substrate layer, such as an oxide layer, has been reached. While the figure depicts only four supply gases, other gases required for various additional wafer processes can be included in the apparatus.

Figure 5:
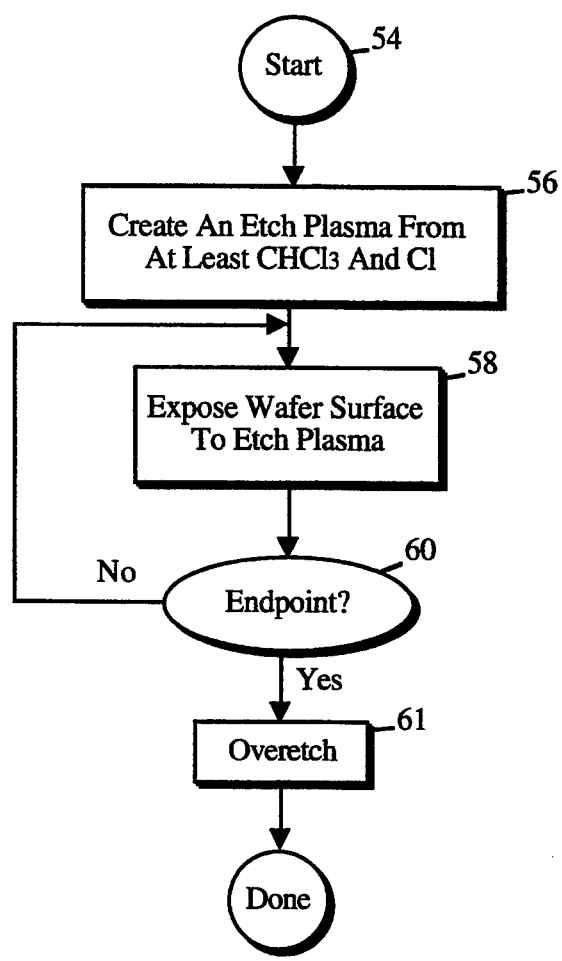
FIG. 5 is a flow diagram of a method in accordance with the present invention.

The flow diagram of FIG. 5 presents a series of steps for etching in accordance with the method of the present invention. The process begins at 54, and in step 56, the etch plasma (40 of FIG. 4) is created. As explained with reference to FIG. 4, the plasma is created by a reaction between the supply of gases $CHCl_3$, $Cl_2$, $BCl_3$, and $N_2$ and the RF energy application. Because the $Cl_2$ is required for Al alloy etching and the $CHCl_3$ is required to provide the preferred slope for the metal line etching, only $CHCl_3$ and $Cl_2$ are essential to the present invention. The RF energy source is powered between about 300 to 500 watts (W), preferably to approximately 400–450 W, while the gas flows of $BCl_3$ and $N_2$ are adjusted to rates between about 10 and 30 sccm, preferably to approximately 20 sccm. $Cl_2$ is supplied at a flow rate between about 20 and 40 sccm, preferably at approximately 30 sccm, and $CHCl_3$ is supplied at a flow rate between about 5 and 15 sccm, preferably at approximately 8 sccm. With these flow rates, the ratio of $Cl_2$ to $CHCl_3$ is maintained within a preferred range of 1.3:1 and 8:1. Thus, other flow rates are also suitable other than the specific ones given by way of example so long as the ratio of gases is maintained.

After a period of approximately thirty seconds for stabilization of the conditions, which includes the pressurization of the chamber to a pressure between about 100 and 300 millitorr (mT) and preferably to a pressure of 200 mT, the wafer is exposed to the plasma in step 58. This etches the metal layer into the desired pattern of narrow and isolated lines as determined by the pattern of closely spaced and more widely spaced features of the mask layer overlying the metal layer. After approximately seventy-five seconds, an endpoint is reached in step 60 as detected by endpoint detector 53, and an overetch process is then performed in step 61, such as to remove residual oxide, as is well known to those skilled in the art. At the end of this overetch, the metal etch process is completed. Of course, these processing times are not limited to those given and are adjustable as required for a desired alteration to the conditions used in this described embodiment of the process.

Figure 6:
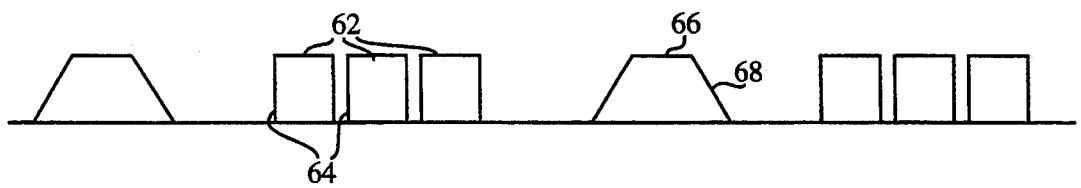
FIG. 6 illustrates a metal layer pattern resulting from the implementation of the method and apparatus of the present invention.

The results of this etching process are illustrated in FIG. 6. As shown, an optimal pattern of narrowly spaced lines 62 having vertical sidewalls 64, and isolated lines 66 having sloped sidewalls 68 on the same die is produced. Thus, the desired optimal shape for both more closely spaced and more widely spaced metal lines is accomplished by controlling the flow rates of the gases $Cl_2$ and $CHCl_3$. The variations in the sidewall sloping that can occur due to variations in the flow rate of $CHCl_3$ are detailed in FIG. 7.

Figure 7:
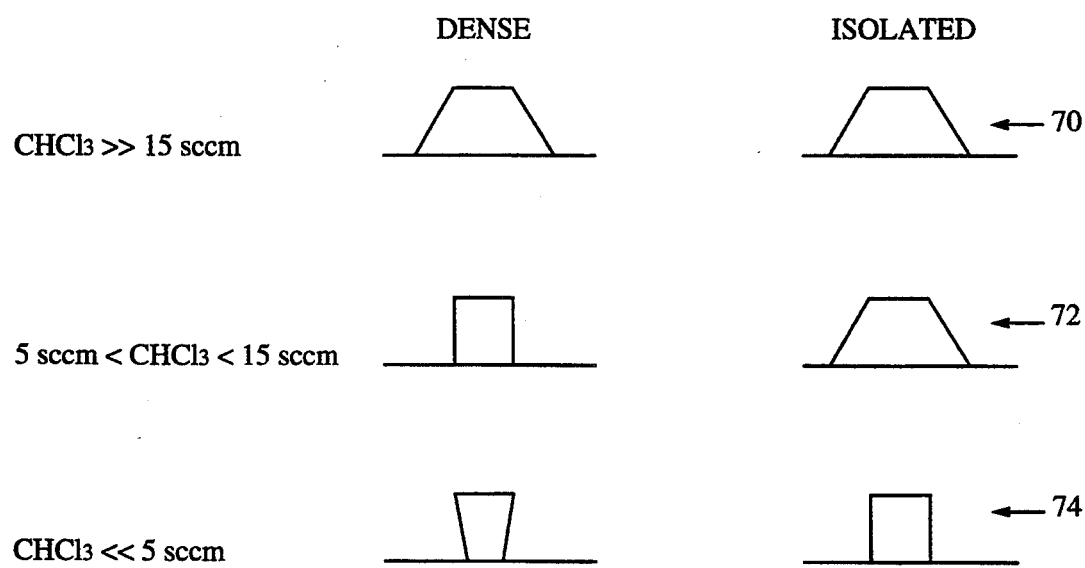
FIG. 7 is a table of the sidewall profiles of dense and isolated metal lines resulting from variations in gas flow rates.

FIG. 7 presents in table form the variations in slope for dense lines and isolated lines as $CHCl_3$ is supplied over a range of flow rates. While the chart illustrates the flow rate of $CHCl_3$, these flow rates are dependent upon the flow rate of Cl$_2$ into the chamber, so that the ratio of Cl$_2$:CHCl$_3$ is preferably maintained between approximately 1.3 and 8. For illustrative purposes, the flow rate of Cl$_2$ is approximately 30 sccm. In row 70, the flow rate of CHCl$_3$ is substantially greater than 15 sccm, and the sidewalls of both dense and isolated lines are sloped. While this sloped shape would be optimal for the isolated lines, possible problems with shorting would occur with the dense lines, as previously discussed. Row 72 illustrates the sidewalls produced by maintaining the flow of CHCl$_3$ at a moderate flow rate between about 5 and 15 sccm. This moderate flow rate results in preferred sidewall slopes for both the dense and isolated lines. The isolated lines have sloped sidewalls which ease subsequent layering, and the dense lines have vertical sidewalls which eliminate the shorting problems that sloped sidewalls cause. For flow rates of CHCl$_3$ substantially below 5 sccm, as shown in row 74, neither the dense nor the isolated lines have the proper sidewall form. Dense lines have reentrant sloped sidewalls, and isolated lines have vertical sidewalls. The reentrant sloping leads to voids along the sidewall after subsequent layering, and the vertical sidewalls provide non-planar layering surfaces for subsequent layers, as previously described. Thus, as the table of FIG. 7 clearly presents, a moderate flow rate of CHCl$_3$ produces the proper sidewall shape for both narrow lines and isolated lines on the same substrate. This reduces die failure by improving the reliability of metal layer patterning.

While this invention has been described in terms of several preferred embodiments, there are alterations, permutations, and equivalents which fall within the scope of this invention. It is therefore intended that the following appended claims be interpreted as including all such alterations, permutations, and equivalents as fall within the true spirit and scope of the present invention.

What is claimed is:

1. A process for patterning a metal layer through a mask, the metal layer being provided over a substrate, the process comprising the steps of:
   creating a flow of at least CHCl$_3$ and Cl$_2$ into a process chamber;
   creating an etch plasma from said flow; and
   exposing the metal layer to the etch plasma through the mask to etch a desired sidewall profile pattern into said metal layer, the desired sidewall profile pattern includes spatially dense lines and spatially isolated lines that are spaced substantially farther apart than the spatially dense lines, and wherein said dense lines have vertical sidewalls and said isolated lines have outwardly sloping sidewalls.

2. A process for patterning a metal layer as recited in claim 1 wherein the step of creating a flow includes the steps of:
   enclosing the substrate in a chamber; and
   flowing CHCl$_3$ and Cl$_2$ into said chamber in a desired proportion to create said desired sidewall profile pattern.

3. A process for patterning a metal layer through a mask as recited in claim 2 wherein said CHCl$_3$ flows into the chamber at a flow rate of between about five and fifteen sccm.

4. A process for patterning a metal layer through a mask as recited in claim 3 wherein said CHCl$_3$ flows into the chamber at a flow rate of between about eight and twelve sccm.

5. A process for patterning a metal layer through a mask as recited in claim 4 wherein said CHCl$_3$ flows into the chamber at a flow rate of about ten sccm.

6. A process for patterning a metal layer through a mask as recited in claim 2 wherein said Cl$_2$ flows into the chamber at a flow rate of between about twenty and forty sccm.

7. A process for patterning a metal layer through a mask as recited in claim 6 wherein said Cl$_2$ flows into the chamber at a flow rate of about thirty sccm.

8. A process for patterning a metal layer provided over a substrate, the process comprising the steps of:
   forming a mask layer over a metal layer, said mask layer having a first region with spatially dense lines and a second region with spatially isolated lines;
   placing the substrate in a chamber;
   creating a gas flow into the chamber including CHCl$_3$ and Cl$_2$; and
   applying energy to the gas flow to create an etch plasma such that the metal layer is exposed to the etch plasma through the mask, wherein the etch plasma etches said spatially dense lines to create vertical sidewalls on said spatially dense lines, and etches said spatially isolated lines to create outwardly sloping sidewalls on said spatially isolated lines.

9. A process for patterning a metal layer as recited in claim 8 wherein the step of creating a gas flow includes providing CHCl$_3$ at a flow rate of between about five and fifteen sccm and providing Cl$_2$ at a flow rate of between about twenty and forty sccm.

10. A process for patterning a metal layer as recited in claim 9 wherein the step of creating a gas flow further includes providing BCl$_3$ at a flow rate of between about ten and thirty sccm and providing N$_2$ at a flow rate of between about ten and thirty sccm.

11. A process for patterning a metal layer as recited in claim 10 wherein the step of creating a gas flow includes providing CHCl$_3$ at a flow rate of about eight sccm, providing Cl$_2$ at a flow rate of about thirty sccm, providing BCl$_3$ at a flow rate of about twenty sccm, and providing N$_2$ at a flow rate of about twenty sccm.

12. A process for patterning a metal layer as recited in claim 8 wherein the step of applying energy includes applying an RF field.

13. A process for patterning a metal layer as recited in claim 12 further comprising the steps of:
   using a controller to monitor a reaction endpoint; and
   the controller to adjust or discontinue the gas flow and the RF field application in response to the detection of the reaction endpoint.

14. A process for patterning a metal layer as recited in claim 8 where the flow rate of Cl$_2$ is between 1.3 and 8 times the flow rate of the CHCl$_3$.

15. A process for patterning a metal layer as recited in claim 12 further comprising the steps of applying the RF field of between about 300 and 500 watts and maintaining the chamber at a pressure of between about 100 and 300 millitorr for a period of time of between about 30 and 120 seconds.

* * * * *